(12) United States Patent
Wolpert et al.

(10) Patent No.: US 10,699,050 B2
(45) Date of Patent: Jun. 30, 2020

(54) FRONT-END-OF-LINE SHAPE MERGING CELL PLACEMENT AND OPTIMIZATION

(71) Applicant: INTERNATIONAL BUSINESS MACHINES CORPORATION, Armonk, NY (US)

(72) Inventors: David Wolpert, Poughkeepsie, NY (US); Erwin Behnen, Austin, TX (US); Lawrence A. Clevenger, Saratoga Springs, NY (US); Patrick Watson, Montrose, NY (US); Chih-Chao Yang, Glenmont, NY (US); Timothy A. Schell, Cary, NC (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 143 days.

(21) Appl. No.: 15/969,841

(22) Filed: May 3, 2018

(65) Prior Publication Data
US 2019/0340324 A1 Nov. 7, 2019

(51) Int. Cl.
  *G06F 30/392* (2020.01)
  *H01L 27/02* (2006.01)
  *G06F 30/394* (2020.01)
  *G06F 30/398* (2020.01)

(52) U.S. Cl.
  CPC .......... *G06F 30/392* (2020.01); *G06F 30/394* (2020.01); *G06F 30/398* (2020.01); *H01L 27/0207* (2013.01)

(58) Field of Classification Search
  CPC ............. G06F 17/5054; G06F 17/5068; G06F 17/5072; G06F 17/5081; G06F 30/392; G06F 30/394; G06F 30/398; H01L 27/0207
  USPC ........................................................ 716/119
  See application file for complete search history.

(56) References Cited

U.S. PATENT DOCUMENTS

| | | |
|---|---|---|
| 5,140,402 A | 8/1992 | Murakata |
| 5,901,065 A | 5/1999 | Guruswamy et al. |
| 5,995,734 A | 11/1999 | Saika |
| 7,207,022 B2 | 4/2007 | Okudaira |
| 7,797,646 B2 | 9/2010 | Chung et al. |
| 7,917,872 B2 | 3/2011 | Tanefusa et al. |
| 8,826,212 B2 | 9/2014 | Yeh et al. |
| 9,262,570 B2 | 2/2016 | Hsu et al. |
| 9,703,911 B2 | 7/2017 | Shin |
| 9,779,197 B1 | 10/2017 | Wagner et al. |
| 9,792,397 B1 | 10/2017 | Nagaraja |

(Continued)

OTHER PUBLICATIONS

Disclosed Anonymously, "Heuristic Method for Power Density & Temperature Profile Refinement", IPCOM000228803D, Date: Jul. 8, 2013.

*Primary Examiner* — Paul Dinh
(74) *Attorney, Agent, or Firm* — Cantor Colburn LLP; Margaret McNamara (57) ABSTRACT

A technique relates to structuring a semiconductor device. First empty cells are placed against hierarchical boundaries of a macro block. Functional cells are added in the macro block. Remaining areas are filled with second empty cells in the macro block. Shape requirements are determined for the first empty cells and the second empty cells. The first and second empty cells are replaced with determined shape requirements.

19 Claims, 9 Drawing Sheets

(56) References Cited

U.S. PATENT DOCUMENTS

| | | | | |
|---|---|---|---|---|
| 2003/0233625 A1* | 12/2003 | Brazell | ............... | G06F 17/5068 716/119 |
| 2014/0167818 A1* | 6/2014 | Eisenstadt | ........... | G06F 17/5054 326/101 |
| 2019/0188353 A1* | 6/2019 | Correale, Jr. | ....... | G06F 17/5072 |

* cited by examiner

FRONT-END-OF-LINE SHAPE MERGING CELL PLACEMENT AND OPTIMIZATION

BACKGROUND

The present invention generally relates to methods and resulting structures for semiconductor devices, and more specifically, to front-end-of-line shape merging cell placement and optimization.

The individual components of an integrated circuit (IC) are extremely small and its production demands precision at an atomic level. IC fabrication is a complex process during which electronic circuits are created in and on a wafer made out of very pure semiconducting material, typically silicon. The manufacturing is a multiple-step sequence which can be divided into two major processing stages, namely front-end-of-line (FEOL) processing and back-end-of-line (BEOL) processing. FEOL refers to the construction of the components of the IC directly inside the wafer. FEOL is the first portion of IC fabrication where the individual devices (such as transistors, capacitors, resistors, etc.) are patterned in the semiconductor. FEOL generally covers all steps up to the deposition of metal interconnect layers. FEOL contains all steps of CMOS fabrication needed to form fully isolated CMOS elements. The processes can include, but are not limited to, selecting the type of wafer to be used, chemical-mechanical planarization and cleaning of the wafer, shallow trench isolation (STI), transistor channel formation, gate module formation, and source and drain module formation.

SUMMARY

Embodiments of the invention are directed to structuring a semiconductor device. A non-limiting example of the semiconductor device includes placing first empty cells against hierarchical boundaries of a macro block, adding functional cells in the macro block, filling remaining areas with second empty cells in the macro block, determining shape requirements for the first empty cells and the second empty cells, and replacing the first and second empty cells with determined shape requirements.

Embodiments of the invention are directed to a computer program product for structuring a semiconductor device. A non-limiting example of the computer program product includes a computer readable storage medium having program instructions embodied therewith. The computer readable storage medium is not a transitory signal per se, and the program instructions are executable by a computer, to cause the computer to perform a method including placing first empty cells against hierarchical boundaries of a macro block, adding functional cells in the macro block, filling remaining areas with second empty cells in the macro block, determining shape requirements for the first empty cells and the second empty cells, and replacing the first and second empty cells with determined shape requirements.

Embodiments of the invention are directed to a computing system for structuring a semiconductor device. A non-limiting example of the computing system includes at least one processor, and memory. The memory having computer-executable instructions that, when executed by the at least one processor, cause the at least one processor to perform operations including placing first empty cells against hierarchical boundaries of a macro block, adding functional cells in the macro block, filling remaining areas with second empty cells in the macro block, determining shape requirements for the first empty cells and the second empty cells, and replacing the first and second empty cells with determined shape requirements.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Very-large-scale integration (VLSI) is the process of creating an integrated circuit (IC) by combining billions of transistors into a single chip. Integrated circuit layout, also known as IC layout, IC mask layout, or mask design, is the representation of an integrated circuit in terms of planar geometric shapes which correspond to the patterns of metal, oxide, or semiconductor layers that make up the components of the integrated circuit. When using a standard process, where the interaction of the many chemical, thermal, and photographic variables is known and carefully controlled, the behavior of the final integrated circuit depends largely on the positions and interconnections of the geometric shapes. Using a computer-aided layout tool, the layout engineer or layout technician places and connects all of the components that make up the chip such that they meet certain criteria, typically performance, size, density, and manufacturability.

Design rule checking or check(s) (DRC) is the area of electronic design automation that determines whether the physical layout of a particular chip layout satisfies a series of recommended parameters called design rules. Design rule checking is a major step during physical verification signoff on the design. Design rules are a series of parameters provided by semiconductor manufacturers that enable the designer to verify the correctness of a mask set. Design rules are specific to a particular semiconductor manufacturing process. A design rule set specifies certain geometric and connectivity restrictions to ensure sufficient margins to account for variability in semiconductor manufacturing processes, so as to ensure that the parts work correctly. Two of the most basic design rules are a width rule that specifies the minimum width of any shape (e.g., the minimum width of a threshold voltage (VT) shape used to define device performance) in the design and a spacing rule that specifies the minimum distance between two adjacent shapes. These rules will exist for each layer of a semiconductor manufacturing process.

The main objective of design rule checking (DRC) is to achieve a high overall yield and reliability for the design. If design rules are violated, the design may not be functional. To meet this goal of improving die yields, DRC has evolved from simple measurement and Boolean checks, to more involved rules that modify existing features, insert new features, and check the entire design for process limitations such as layer density. A completed layout consists not only of the geometric representation (shape requirements) of the design, but also data that provides support for the manufacture of the design. While design rule checks do not validate that the design will operate correctly, they are constructed to verify that the structure meets the process constraints for a given design type and process technology (for fabrication).

DRC software can take as input a layout in the OASIS format (or the older GDSII standard format) and a list of rules specific to the semiconductor process chosen for fabrication. From these, DRC software produces a report of design rule violations that the designer may or may not choose to correct. Carefully "stretching" or waiving certain design rules is often used to increase performance and component density at the expense of yield. Some examples of DRCs in IC design include: active to active spacing, well to well spacing, the minimum channel length of the transistor, minimum metal width, metal to metal spacing, metal fill density (for processes using CMP), poly density, ESD and I/O rules, antenna effect, etc.

Turning now to an overview of technologies that are more specifically relevant to aspects of the invention, design rule checks (DRC) have a spacing dead zone between devices with the same threshold voltage (VT), where one transistor region's VT shape may either abut or be spaced a minimum distance to the next transistor region's VT shapes. Automated tools cannot run DRC every placement iteration spanning millions of cells. Threshold voltage (VT) gradients can impact the performance of devices (near the boundary) differently than those that are placed in the middle of a given VT region. This will have a larger impact on critical paths as technology scales in integrated circuits.

Turning now to an overview of the aspects of the invention, one or more embodiments of the invention address the above-described shortcomings of the prior art by providing techniques for structuring integrated circuits of semiconductor devices. Embodiments of the invention provide automated front-end-of-line shape merging cell placement and optimization for very-large-scale integration (VLSI). Embodiments of the invention provide the ability to freely place standard cells with varying alignment periodicities, routing needs, and critical path locations in integrated circuits. A mechanism is provided for enabling the merging of randomly placed shapes to ensure DRC compliance while maintaining performance integrity regardless of cell placement solution, neighboring cell timing sensitivities, and concurrent hierarchical design boundaries. Further, embodiments of the invention provide techniques (which can include automated tooling) to create a DRC compliant "brick wall" and then to further optimize that "brick wall" via an iterative process (e.g., a software application or machine learning) to guarantee performance and/or enhance performance of the semiconductor device.

Figure 1A:
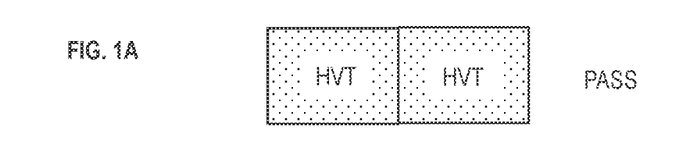
FIG. 1A depicts a design rule check for two cells of a semiconductor layout for a semiconductor device according to embodiments of the invention.

Turning now to a more detailed description of aspects of the present invention, FIG. 1A depicts a design rule check for two cells of a semiconductor layout for a semiconductor device. The design rule check of the cells is performed by a computer system 600 (or computer). In FIG. 1A, the cells represent two transistor regions in which both transistor regions have a high threshold voltage (HVT). The design rule check is a pass because two transistor regions having the same threshold voltage (VT) can abut and/or be adjacent to one another in the semiconductor layout. Abut means that two neighboring cells touch one another because of a common boundary.

Figure 1B:
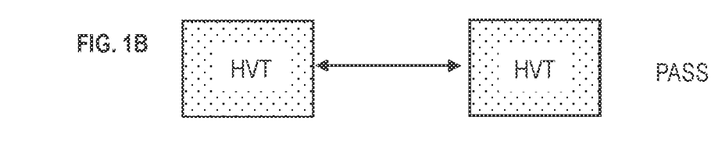
FIG. 1B depicts a design rule check for two cells of a semiconductor layout for a semiconductor device according to embodiments of the invention.

FIG. 1B depicts a design rule check for two cells of a semiconductor layout for a semiconductor device. In FIG. 1B, the cells represent two transistor regions in which both transistor regions have a high threshold voltage (HVT). The design rule check is a pass because two transistor regions having the same threshold voltage (VT) are allowed to be spaced apart at least a predefined minimum distance in the semiconductor layout. As such, the design rule check is a pass because the spacing between the two same types of cells meets (or exceeds) the minimum predefined distance.

Figure 1C:
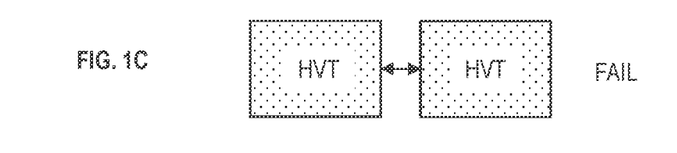
FIG. 1C depicts a design rule check for two cells of a semiconductor layout for a semiconductor device according to embodiments of the invention.

FIG. 1C depicts a design rule check for two cells of a semiconductor layout for a semiconductor device. In FIG. 1C, the cells represent two transistor regions in which both transistor regions are HVT cells. The two HVT cells are not spaced apart the predefined minimum distance (i.e., do not at least meet the predefined minimum distance requirement) but are not close enough to abut and/or touch one another. Because the cells are the same type (e.g., HVT cells) and predefined minimum distance is not met for the same type of cells, the design rule check is a fail. However, it is noted that there is no such requirement for spacing between different masks which are, for example, cells representing two transistor regions of different types.

Figure 1D:
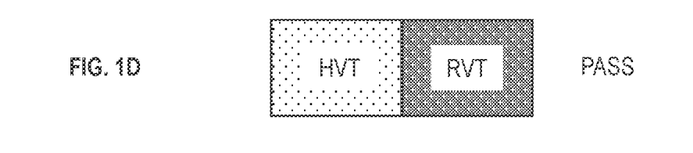
FIG. 1D depicts a design rule check for two cells of a semiconductor layout for a semiconductor device according to embodiments of the invention.

FIG. 1D depicts a design rule check for two cells of a semiconductor layout for a semiconductor device. In this case, the design rule check is between two cells representing two transistor regions, in which one transistor region has a high threshold voltage (HVT) and the other transistor region has a regular threshold voltage (RVT). The threshold voltage value for RVT is below the threshold voltage value for HVT. The HVT can be a predefined threshold voltage range, and the RVT can include a different predefined threshold voltage range lower than the range for the HVT. As another example cell, there can also be a low threshold voltage (LVT) cell (e.g., set of one or more transistors) having yet a different predefined low threshold voltage range lower that the RVT range. In FIG. 1D, the HVT cell abuts and/or is adjacent to the RVT cell, and the design rule check is a pass because two cells (e.g., transistor regions) having different threshold voltages (VT) are permitted to abut and/or be adjacent to one another in the semiconductor layout.

Figure 1E:
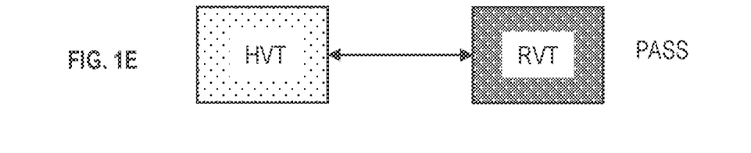
FIG. 1E depicts a design rule check for two cells of a semiconductor layout for a semiconductor device according to embodiments of the invention.

FIG. 1E depicts a design rule check for two cells of a semiconductor layout for a semiconductor device. In this case, the design rule check is between two cells representing two transistor regions, in which one transistor region is HVT and the other transistor region is RVT. Two different type cells (e.g., HVT cell and RVT cell) or even the same type of cell (HVT and HVT cells, RVT and RVT cells, or LVT and LVT) are allowed to be spaced apart at least a predefined minimum distance in the semiconductor layout. As such, the design rule check is a pass because the spacing between the two different types of cells meets (or exceeds) the minimum predefined distance.

Figure 1F:
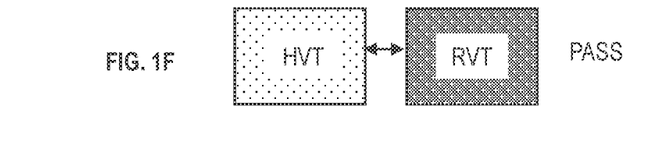
FIG. 1F depicts a design rule check for two cells of a semiconductor layout for a semiconductor device according to embodiments of the invention.

FIG. 1F depicts a design rule check for two cells of a semiconductor layout for a semiconductor device. Again, in this case, the design rule check is between two cells representing two transistor regions, in which one transistor region is HVT and the other transistor region is RVT. The design rule check is a pass because there is no spacing requirement between transistor regions of different types (such as between, for example, HVT and RVT regions).

Figure 1G:
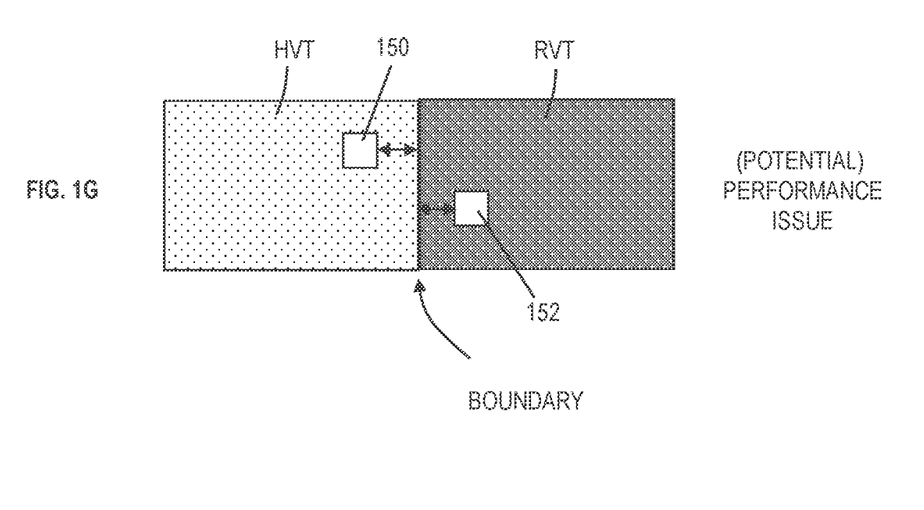
FIG. 1G depicts a design rule check for two cells of a semiconductor layout for a semiconductor device according to embodiments of the invention.

FIG. 1G depicts a design rule check for two cells of a semiconductor layout for a semiconductor device. Again, FIG. 1G depicts two cells representing two transistors regions in which one transistor region is HVT and another transistor region is RVT. Two transistors 150 (e.g., HVT transistor) and 152 (RVT transistor) are identified in the HVT cell and the RVT cell, respectively, although numerous transistors are in each cell according to the type of threshold voltage region. There is a boundary between the two abutting cells. The HVT transistor 150 is close to the boundary, and the RVT transistor is close to the boundary, where close is defined as a less than predefined minimum boundary distance for two different threshold voltage transistors. This scenario is referred to as threshold voltage gradients. Threshold voltage gradients can impact the performance of devices (such as, for example, HVT transistor 150 and RVT transistor 152) close to the boundary of two different types of cells differently than those devices that are placed in the middle of a given VT region. In other words, the HVT transistor 150 in the HVT region is too close (does not meet a predefined minimum space/boundary requirement for devices in two different types of transistor regions) to the RVT transistor 152 in the RVT region, although the design rule check passes because the cells of different types are abutting and there is no limitation to abutting shapes between different manufacturing masks. In addition to this threshold voltage gradient, mask alignment issues may shift the boundaries of the threshold voltage regions, additionally impacting device performance. Having devices in different types of cells, such as transistor 150 in HVT transistor region and transistor 152 in RVT transistor regions, makes an impact on critical paths and makes an even larger impact on critical paths as technology scales (i.e., reduces in size). This case can present a problem in the semiconductor layout for a semiconductor device because the design rule checking results in a pass, although the close proximity of transistor 150 and 152 can produce performance issues such as delay (timing) problems and increased power consumption.

Figure 1H:
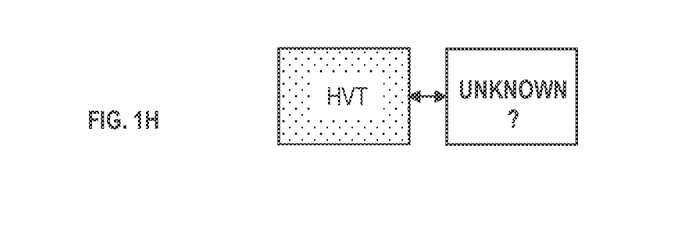
FIG. 1H depicts a design rule check for two cells of a semiconductor layout for a semiconductor device according to embodiments of the invention.

FIG. 1H depicts a design rule check for two cells of a semiconductor layout for a semiconductor device. In this case, one cell is known, for example, an HVT cell, while the other cell is unknown. The unknown cell is a black box because the type of cell is unknown at this time. The unknown cell can be for the RVT region, LVT region, HVT region, etc. The unknown cell is not abutting the known cell and does not meet the predefined minimum distance for the same type of cells. This case presents a problem in the semiconductor layout for a semiconductor device.

According to embodiments of the invention, FIGS. 2A, 2B, 2C, 2D, FIGS. 3A, 3B, 3C, FIG. 4, and FIG. 5 provide techniques to freely place standard cells with varying alignment periodicities, routing needs, and critical path locations in a semiconductor layout for building a semiconductor device using the computer system 600. The computer system 600 has one or more software applications 602 configured to function and implement operations as discussed herein. The software applications 602 provide a mechanism for enabling the merging of randomly placed shapes to ensure DRC compliance while maintaining performance integrity regardless of cell placement solution, neighboring cell timing sensitivities, and concurrent hierarchical design boundaries.

According to embodiments of the invention, software applications 602 can function as an automated tooling to create a DRC compliant "brick wall" and then further optimize that "brick wall" (via machine learning or iterative processing) to guarantee performance and/or enhance the performance of the semiconductor device.

Figure 4:
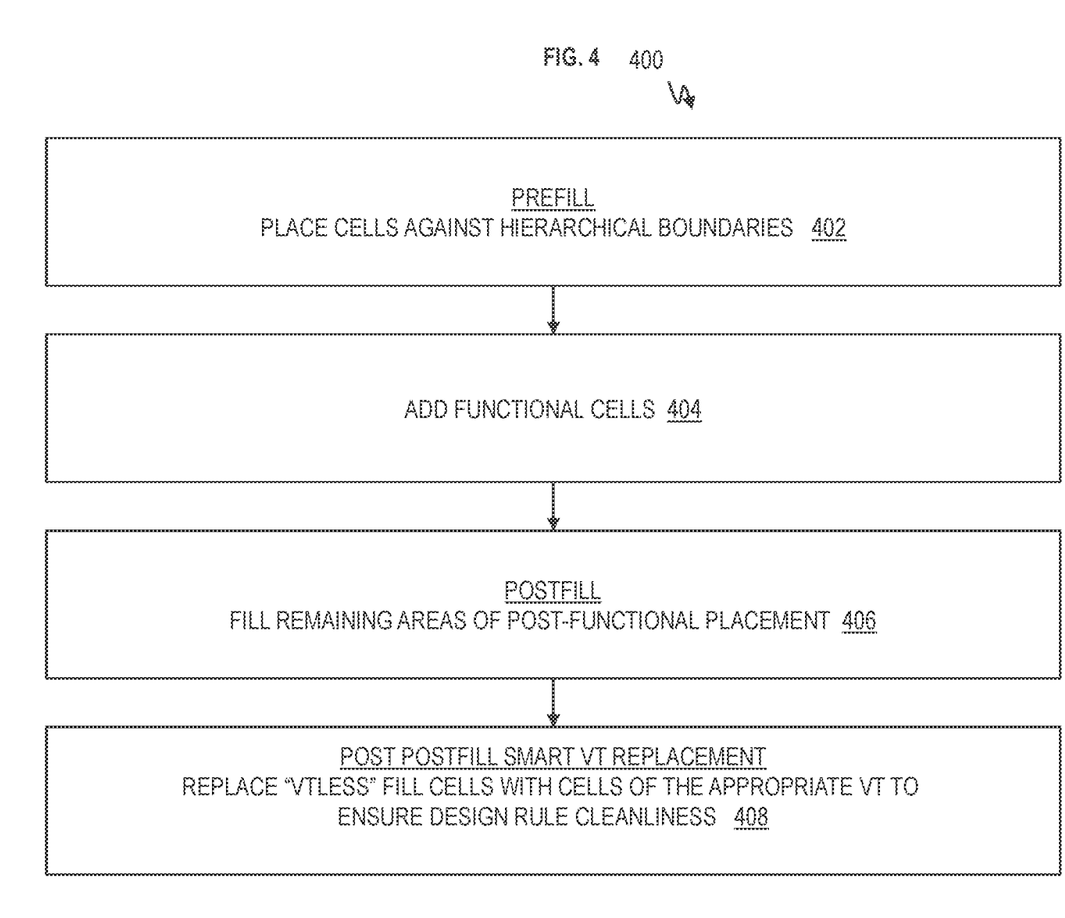
FIG. 4 depicts a flowchart of a process to guarantee design rule check cleanliness for a semiconductor device according to embodiments of the invention.
Figure 6:
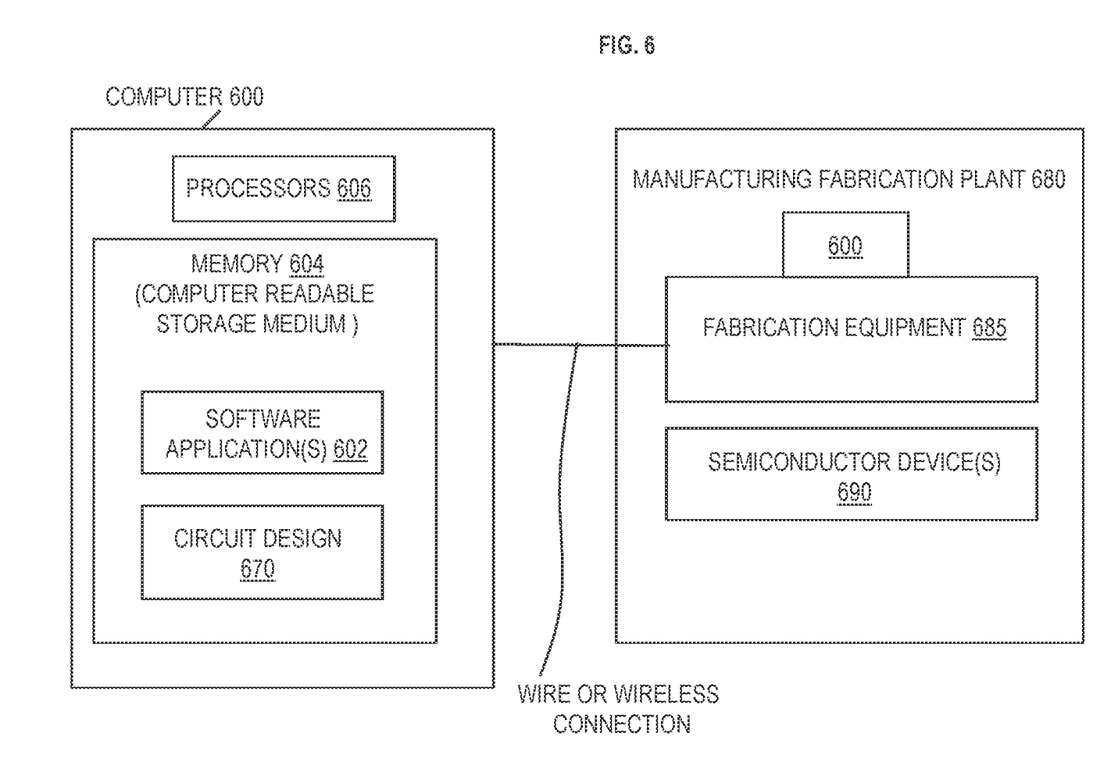
FIG. 6 depicts a system of a computer system integrated with a manufacturing fabrication plant according to embodiments of the invention.

FIGS. 2A, 2B, 2C and 2D depict stages of building a semiconductor device according to embodiments of the invention. FIG. 4 depicts a flowchart 400 of a process configured to guarantee design rule check cleanliness (i.e., pass) for the semiconductor device according to embodiments of the invention. A semiconductor layout 200 is constructed by the software application 602 of the computer 600 to build the semiconductor device (e.g., an integrated circuit). The computer 600 is configured to configured to guarantee design rule cleanliness (i.e., pass) for the semiconductor device before and/or without requiring a design rule check. The software applications 602 include, integrate, are coupled to, and/or function as electronic design automation (EDA), also referred to as electronic computer-aided design (ECAD). Electronic design automation is a category of software tools for designing electronic systems such as integrated circuits and printed circuit boards. The tools work together in a design flow that chip designers use to design and analyze entire semiconductor chips. In some implementations, the computer 600 is coupled to, integrated with, and/or part of the fabrication equipment 685 at the manufacturing fabrication plant 680 (so as to communicate with and/or control operations of the fabrication equipment 685) to thereby fabricate semiconductor device(s) 690 as depicted in FIG. 6, as understood by one skilled in the art. The computer 600 includes one or processors 606 configured to execute one or more software applications 602 in memory 604. The computer 600 receives input of a design 670 for the semiconductor device 690, and the computer 600 is configured to develop/form the semiconductor layout 200 for the semiconductor device in order to build the semiconductor device. The semiconductor layout 200 is a physical design released to the manufacturing fabrication (Fab) plant 680 and physically fabricated by the fabrication equipment 685 to produce the semiconductor device 690. The manufacturing fabrication plant 680 builds the photo mask from the semiconductor layout 200 as a physical design, and then builds the actual product using the photo mask. The product is an integrated circuit (i.e., semiconductor device 690) on a wafer according to the semiconductor layout 200 (physical design). There may be numerous integrated circuits on a wafer, and each integrated circuit may be diced into an individual chip.

Turning to FIG. 4, at operation 402, the computer 600 is configured to place/insert cells against hierarchical boundaries during prefill. For example, stage 251 depicts the semiconductor layout 200 which can have numerous macro blocks, for example, hundreds, thousands, etc. For ease of understanding, only two macro blocks are illustrated. Although only macro block 201 is discussed, it should be understood that discussions about macro block 201 apply by analogy to other macros blocks in the semiconductor layout 200. A macro block is a collection of cells (with each cell containing one or more transistors) that provides a useful layer of hierarchical abstraction for designing an integrated circuit that may contain billions of transistors. To form the semiconductor device, the computer 600 places a child cell 202 in the macro block 200 and places empty cells at the hierarchical boundaries, as depicted at stage 251 and operation 402. For illustration purposes, the hierarchical boundaries are defined to be lateral (e.g., on the left or right sides of identified cells) in the x-axis. The child cell 202 is a child macro block that is hierarchically within (larger) parent macro block 201. The child cell 202 has two boundaries which are on the left and right sides in the x-axis. The child cell 202 can be one or more LVT regions, RVT regions, and/or HVT regions. Likewise, the macro block 201 is surrounded by other macro blocks and can be hierarchically within an even larger macro block. The macro block 201 has two boundaries, which are on the left and right in the x-axis. As such, the computer 600 is configured to laterally insert empty cells 204 on the sides (left and right in this illustration) of the child cell 202 and (parent) macro block 201 of the semiconductor layout 200. At stage 251 in FIG. 2A, the empty cells 204 are used to ensure that, despite any additional cells that may be added in future steps, the empty cells 204 can be changed to an appropriate threshold voltage type such that there will always be a solution that will satisfy the design rule checks with respect to the child cell 202 and the larger macro block 201. The placement of these empty cells 204 ensures/guarantees that the design rule check can be met such that no design rule check is necessary because this is a correct-by-construction technique. The empty cells 204 are not identified as LVT regions, RVT regions, or HVT regions at this point, which means the empty cells 204 have not been filled with any shape. The empty cells 204 serve as a placeholder in the semiconductor layout 200.

Figure 2A:
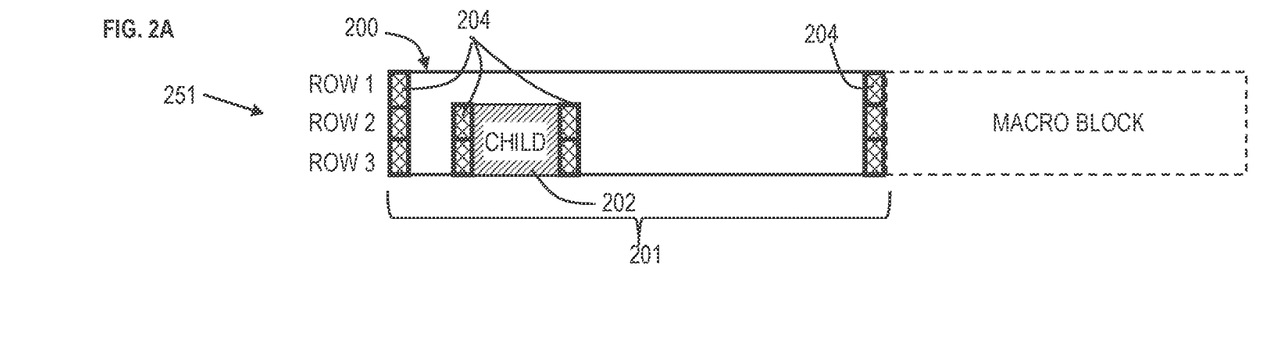
FIG. 2A depicts a stage in building a semiconductor device according to embodiments of the invention.
Figure 2B:
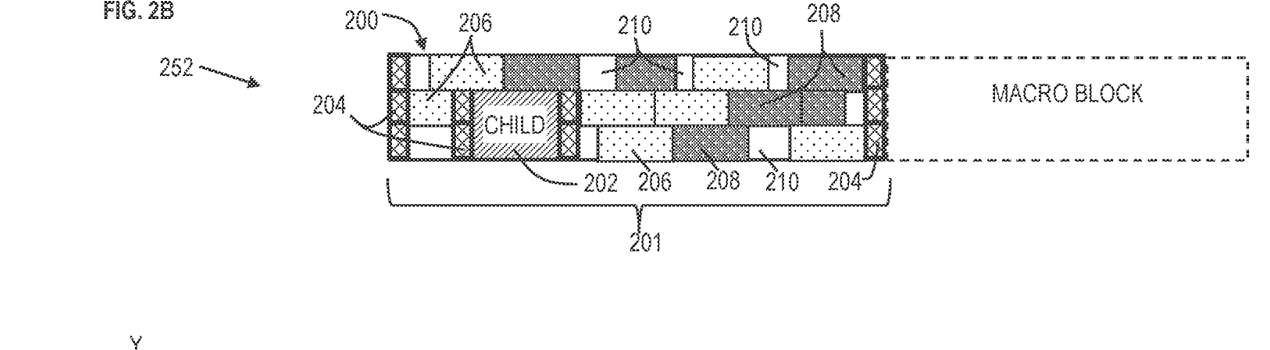
FIG. 2B depicts a stage in building the semiconductor device after further operations according to embodiments of the invention.

At operation 404, the computer 600 is configured to add functional cells in the semiconductor layout 200 for building the semiconductor device 690. The functional cells are the cells (having many devices) that perform operations in the semiconductor device. The design shape is the type of functional cell, and functional cells can include HVT regions, RVT regions, and LVT regions. The functional cells include and/or operate as various logic blocks such as inventers, AND gates, OR gates, etc. At stage 252 in FIG. 2B, the computer 600 adds HVT (functional) cells 206 for HVT regions and RVT (functional) cells 208 for RVT regions as simple illustrations. It should be appreciated that other functional cells can also be added during stage 252. Each of the functional cells perform operations in an integrated circuit as understood by one skilled in the art. In the semiconductor layout 200, the computer 600 leaves blank spaces 210 in which no functional cells such as HVT cells 206 and RVT cells 208 have been added and where no empty cells 204 have been added, as depicted in FIG. 2B.

Figure 2C:
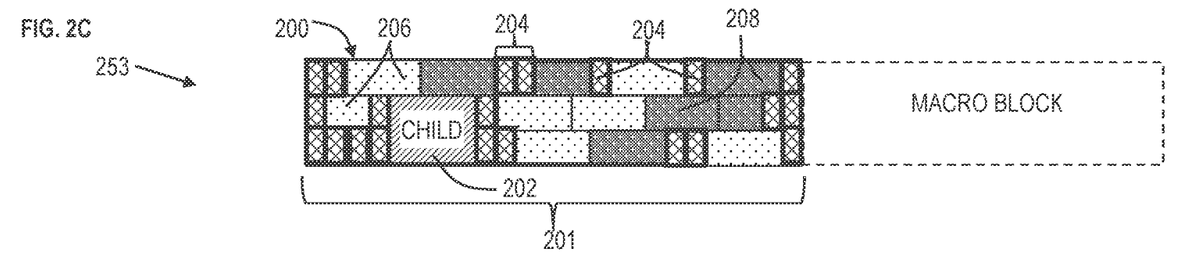
FIG. 2C depicts a stage in building the semiconductor device after further operations according to embodiments of the invention.

At operation 406, post-fill is performed in which the computer 600 is configured to fill in the remaining areas or blank spaces 210 with additional empty cells 204. Stage 253 in FIG. 2C depicts additional empty cells 204 added in each of the previous blank spaces 210. As previously depicted in stages 251-253, each empty cell 204 has a predefined minimum width in the x-axis which is guaranteed to meet the design rule check. The width in the x-axis of one empty cell 204 does not meet the predefined minimum spacing between two cells having the same type of threshold voltage. Two empty cells 204 meets or exceeds the predefined minimum spacing requirement between two cells having the same type of threshold voltage (e.g., two neighboring but not abutting HVT regions, two neighboring but not abutting RVT regions, or two neighboring but not abutting LVT regions). None of the empty cells has a threshold voltage (VT) region designated at this time and are thus "VTless". This occurs as post-functional placement because the functional cells have already been placed.

At operation 408, post postfill using smart threshold voltage replacement is performed in which the computer 600 is configured to replace the "VTless" fill cells with cells of the appropriate threshold voltage to ensure design rule cleanliness (i.e., ensure the design rules are met even without being required to run the design rule check). At stage 254 in FIG. 2D, the computer 600 is configured to execute a fill routine that fills in and/or replaces each empty cell 204 with the appropriate threshold voltage resulting in non-functional cells 216 and 218. The non-function cells can be LVT regions, RVT regions, and/or HVT regions. The non-functional cells 218 have a designated threshold voltage as, for example, RVT regions, and the non-functional cells 216 have a designated threshold voltage as, for example HVT regions. Other types of non-functional cells can be included too. The non-functional cells 216 and 218 each contain transistors corresponding to the designated threshold voltage (HVT region, RVT region), and the threshold voltage is a physical (structural) property of the respective transistors in the non-functional cells and 216 and 218. For example, the transistors in the non-functional cells 216 and 218 have their threshold voltage determined by the type of dopants in their source/drain, the work function metal in their gate stack, and/or the thickness of their gate dielectric. Therefore, the threshold voltage is structured to be high, regular, and low according to the HVT region, RVT region, and LVT region, even though there might be no power provided to the transistors in the non-functional cells 216 and 218.

The fill routine can be implemented in the software application 602 and/or coupled to the software application 602. Each semiconductor layout 200 is a grid on a wafer/substrate, and the grid has rows (for example rows 1, 2, and 3 are identified in FIG. 2A). As one example of the fill routine of the software application 602, the fill routine scans from left-to-right (in the x-axis) in each row in the semiconductor layout 200. The fill routine scans each row, for example, starting with the top row and/or scans all three rows concurrently. As the fill routine (i.e., software application 602) scans, it identifies both the empty cells 204 and the functional cells (e.g., HVT cells 206 and RVT cells 208). As the fill routine scans from left-to-right (as one example), each time the fill routine encounters a functional cell, the immediately following empty cell 204 is set to the same threshold voltage of the immediately prior functional cell. For example, continuing the assumption that that the fill routine is scanning from left-to-right in the x-axis in the top row (row 1), it is assumed that the fill routine encounters the first RVT cell 208A (functional cell). The subsequent empty cells 204 immediately after (i.e., to the right of) the first RVT cell 208A are replaced with the same threshold voltage type (or filled with the same design shape) as the previous (function cell) RVT cell 208A until another functional cell is reached during the scan proceeding left-to-right. Therefore, the two immediately following non-functional cells 218 are set the same type of threshold voltage, i.e., RVT region, as the previous RVT cell 208A because there is not intervening functional cell. This replacement process continues until the end of the first row, and then the subsequent rows are processed and filled accordingly. In some situations, there is no functional cell immediately to the left of some empty cells 204 in a row because the particular row starts with empty cells 204, as illustrated in row 1. In such a case, while scanning from left-to-right, the fill routine (e.g., software application 602) is configured to identify each of the starting empty cells 204 to the left of a functional cell (i.e., having a threshold voltage) and designate the starting empty cells 204 with the same threshold voltage as the functional cell to the right of the starting empty cells 204 when the empty cells 204 have no functional cell immediately to the left in the macro block 201. As can be seen, the first two non-functional cells 216 in the first row (row 1) in stage 254 (scanning from left-to-right) are designated has HVT regions just like the functional HVT cell 206 immediately to the right. It is noted that this is one example of a fill routine configured to function according to embodiments of the invention. By analogy, the fill routine could scan from right-to-left.

Figure 2D:
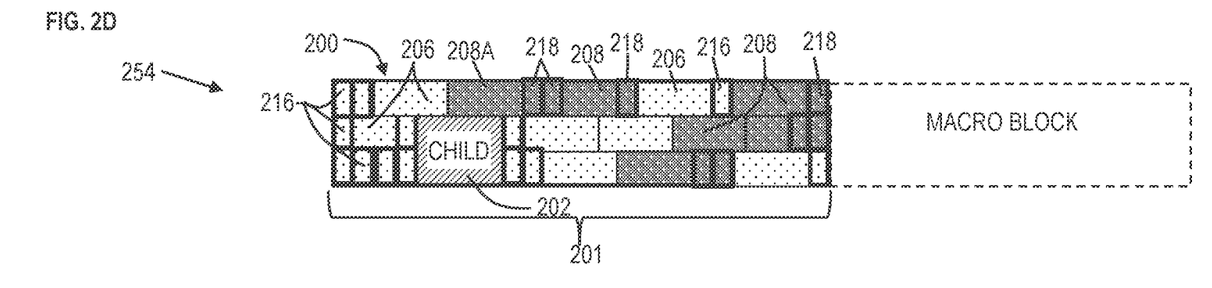
FIG. 2D depicts a stage in building the semiconductor device after further operations according to embodiments of the invention.

As seen in stage 254, the macro block 201 (and any others) is filled with cells in order to build the semiconductor device 690, and the semiconductor layout 200 does not require a design rule check to be performed because the semiconductor layout 200 was constructed as a guaranteed clean fill strategy. Each cell can be considered a collection of design shapes as understood by one skilled in the art.

Technical benefits and advantages provide a cell-based correct-by-construction technique which does not simply merge shapes in a semiconductor device but guarantees meeting design rule check without or prior to any design rule check. Thereby, the correct-by-construction technique improves the integrated circuit (i.e., semiconductor device 690), and improves the operation of the integrated circuit (e.g., used in a computer system) by preventing potential errors discussed herein. Technical benefits include (1) run-time improvement which is part of the general cell fill routine, (2) flow simplification in which there is no need for DRC-compliant shape file generation, DRC run, and/or fix-up script, and (3) hierarchical correctness built into the algorithm instead of generating/fixing against check cells.

Figure 3A:
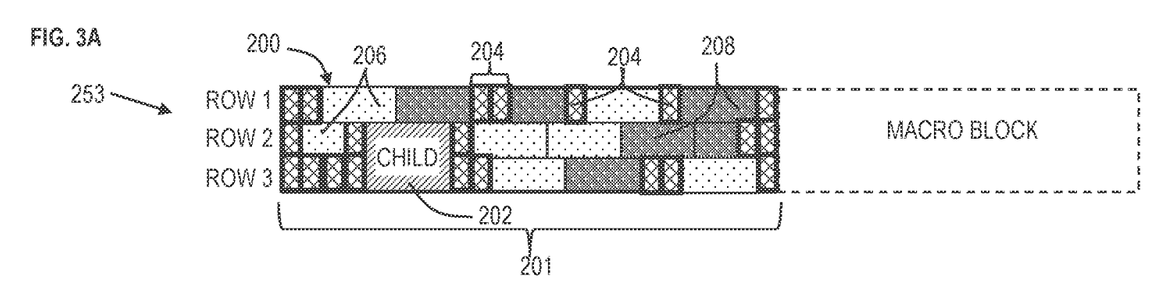
FIG. 3A depicts a stage in building a semiconductor device according to embodiments of the invention.
Figure 3B:
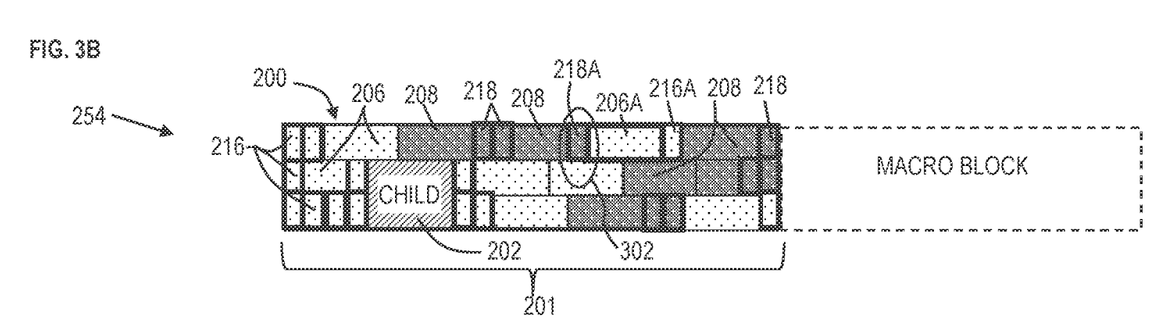
FIG. 3B depicts a stage in building the semiconductor device after further operations according to embodiments of the invention.
Figure 3C:
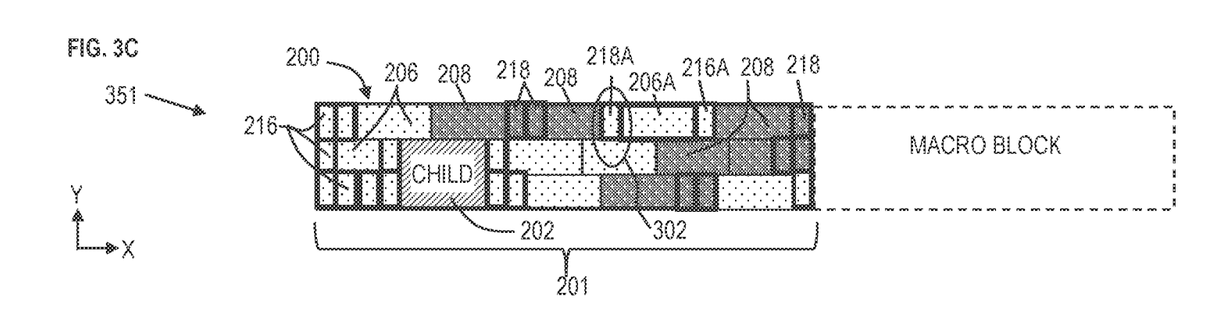
FIG. 3C depicts a stage in building the semiconductor device after further operations according to embodiments of the invention.
Figure 5:
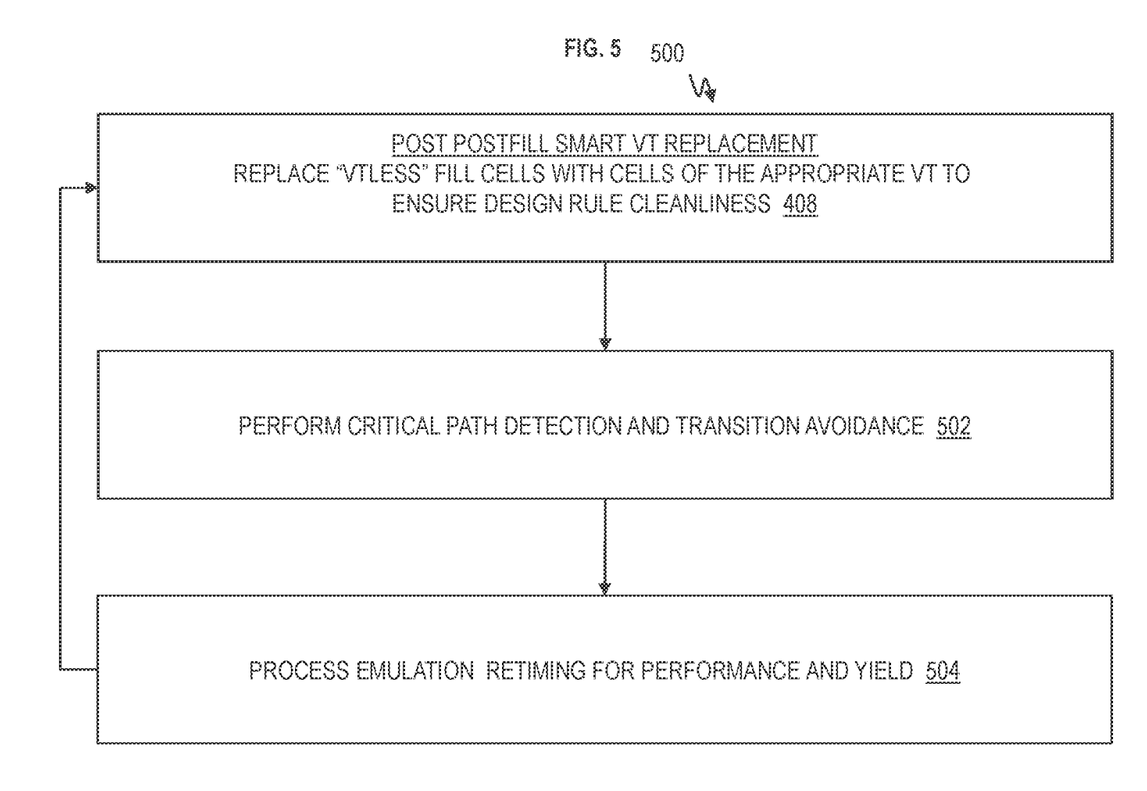
FIG. 5 depicts a flowchart of iterative solution enhancements according to embodiments of the invention.

Further optimization can be made in addition to the guaranteed design rule check cleanliness (i.e., pass) for the semiconductor device 690 in FIG. 4. FIGS. 3A, 3B, and 3C depict further stages (or optimization) of building the semiconductor device 690 according to embodiments of the invention. FIG. 5 depicts a flowchart 500 of iterative solution enhancements according to embodiments of the invention. As an enhancement, the flowchart 500 continues from operation 408 in FIG. 5 and the building of the semiconductor device continues from stage 253 in FIG. 3A. As previously discussed, the post postfill smart VT replacement occurs at operation 502 by filling in all the previous blank spaces 210 (in FIG. 2B) with empty cells 204 as depicted in stage 253 in FIG. 3A.

At operation 502, the software application 602 is configured to perform critical path detection and transition avoidance. As a result, the software application 602 has identified, for example, HVT cell 206A as a critical cell and/or critical path in the macro block 201 (and/or in the semiconductor device) as depicted in stage 254 in FIG. 3B. Additionally, the software application 602 is configured to find potential performance issues that can arise (as discussed in FIG. 1E) with respect to the critical cell and/or critical path which is HVT cell 206A. Because the critical HVT cell 206A abuts/touches an RVT region which is non-functional cell 218A, the software application 602 (determines and) identifies the non-functional cell 218A (highlighted by 302) as causing a (potential) performance issue. In other words, the critical HVT cell 206A is predefined in advance such that the software application 602 knows that HVT cell 206A is a critical functional cell. The critical HVT 206A can be predefined in advance in the design 670 provided to the software application 602. Because the abutting cells of different threshold voltages are to be avoided, the software application 602 performs (threshold voltage) transition avoidance. As one example, the software application 602 is configured to change the neighboring abutting non-functional cell 218A from an RVT region to an HVT region as depicted in stage 351 in FIG. 3C. As another example, suppose the critical HVT cell 206A abuts/touches an RVT region which is a functional cell, software application 602 can move that functional cell having the RVT region to another location that does not abut critical HVT cell 206A such that the critical cell will only be abutted by cells of the same threshold voltage type (which is HVT region in this example). Optionally, the critical HVT cell 206A can be moved such that it only abuts cells of the same threshold voltage type.

Performing critical path detection and transition avoidance improves variation tolerance in the integrated circuit (e.g., semiconductor device 690). This could further include modeling of neighboring cell influences, in order to minimize this cell to cell performance impact. The cell to cell performance impact is having a cell of one threshold voltage abutting/against a cell of a different threshold voltage.

Additionally, at operation 504, software application 602 is configured to perform process emulation retiming for performance and yield. The software application 602 can also exploit this neighbor concept to provide multiple timing rule options for a given library cell depending on its neighboring cells, in order to reflect the performance impact of different VT types on each edge to the library cell's transistor timing. For example, if a functional cell is placed with RVT on both sides, it would use a timing rule 1 reflecting the transistor performance impact of RVT regions on each side and their impacts to nearby transistors within the library cell. When placed with HVT on both sides, the library cell would use a timing rule 2, when placed with HVT on one side and RVT on another side, it would use a timing rule 3, etc.

The process in FIG. 5 is iterative and thus continues such that further replacements can occur to improve performance of the integrated circuit (e.g., semiconductor device 690).

Figure 7:
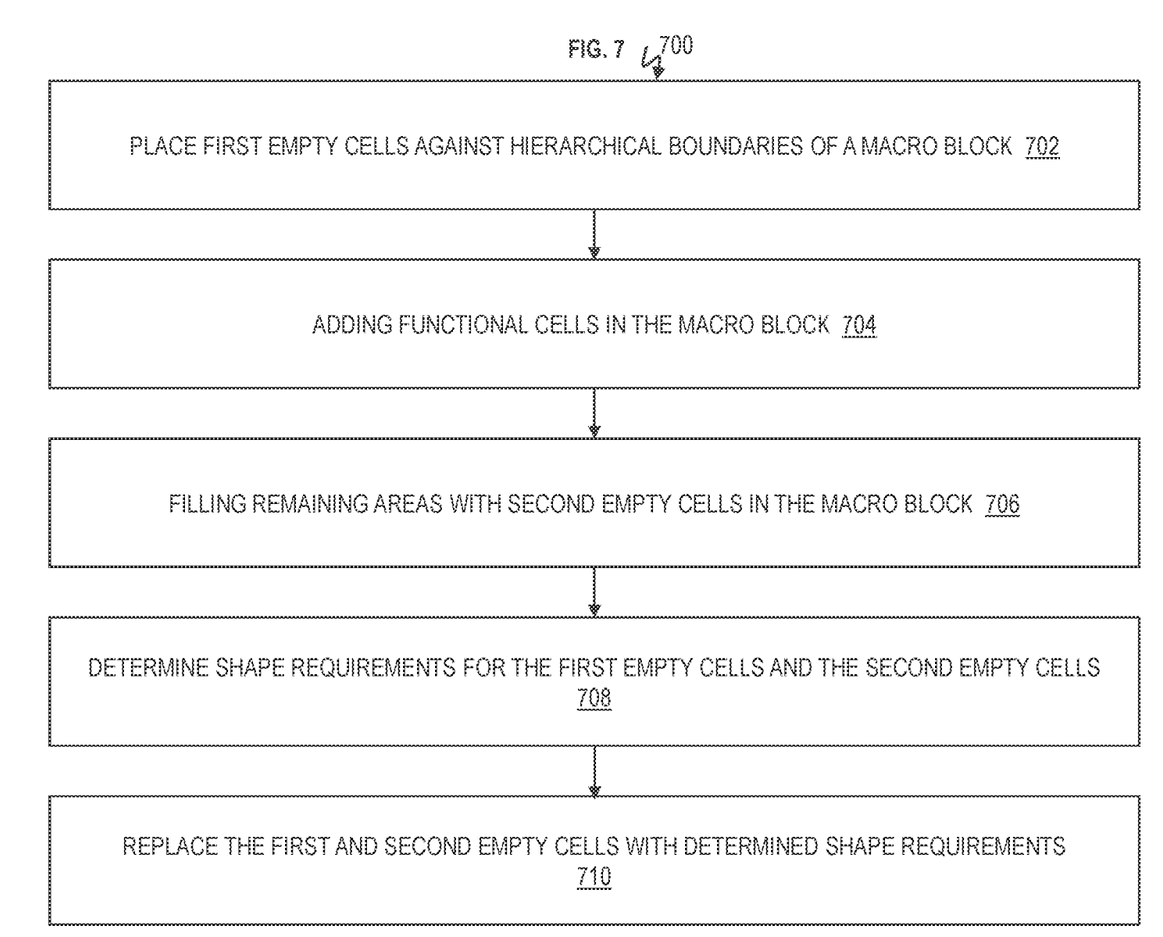
FIG. 7 depicts a flow chart of a method of structuring a semiconductor device according to embodiments of the invention.

FIG. 7 is a flow chart 700 of a method of structuring a semiconductor device according to embodiments of the invention. At block 702, the computer 600 is configured to place first empty cells (e.g., bordering empty cells 204 as the brick wall depicted in stage 251 of FIG. 2A) against hierarchical boundaries of a macro block (e.g., macro block 201).

At block 704, the computer 600 is configured to add functional cells (e.g., functional cells 206 and 208 as depicted in stage 252) in the macro block 201 at block 704. At block 706, the computer 600 is configured to fill remaining areas with second empty cells (e.g., remaining areas or blank spaces 210 are filled with additional empty cells 204 depicted in stage 253 of FIG. 2C) in the macro block 201.

At block 708, the computer 600 is configured to determine shape requirements for the first empty cells and the second empty cells (e.g., empty cells 204). At block 710, the computer 600 is configured to replace the first and second empty cells 204 with determined shape requirements as depicted in stage 254 of FIG. 2D. For example, the empty cells 204 are replaced with non-functional cells 216 and 218 according to a predefined circuit design 670.

Further, the computer 600 is configured to detect at least one functional cell as at least one critical cell (e.g., functional cell 206A). The computer 600 is configured to identify any cells bordering the at least one functional cell as one or more identified cells. For example, the computer 600 is configured to identify the cells on the left and right of functional cell 206A using, for example, the predefined circuit design 670. The computer 600 is configured to determine/recognize that the cell immediately (abutting) to right, which is empty cell 216A in the top row in stage 254 in FIG. 3B, has the same voltage threshold (HVT region) as the critical cell/functional cell 206A, and therefore this empty cell 216A immediately to the right is ensured to pass DRC requirements against the cell 206A.

The computer 600 is configured to determine that the one or more identified cells have a different shape requirement (e.g., different threshold voltage) than the at least one functional cell 206A. In an example case, the critical cell/functional cell 206A has the HVT region while the non-functional cell 218A immediately (abutting) to the left has the RVT region as depicted in stage 254 in FIG. 3B.

In response to the one or more identified cells having the different shape requirement being one of more of the first empty cells and the second empty cells, computer 600 is configured to change the one or more identified cells (e.g., non-functional cell 218A) to a same shape requirement (e.g., HVT region) as the at least one critical cell/functional cell 206A in stage 351 of FIG. 3C. The same shape requirement comprises a level for a threshold voltage.

In response to the one or more identified cells having the different shape requirement being one or more of the functional cells, computer 600 is configured to move the one or more identified cells to a location that does not border the at least one functional cell. For example, the one or more identified cells could be a functional cell 208 with the RVT region which abuts the critical/function cell and therefore this RVT functional cell cannot be changed/flipped to the same threshold voltage as the critical/function cell. Accordingly, this RVT functional cell can be moved to a different location in the macro block 201 and then replaced with a non-functional cell having the same threshold voltage as the critical/function cell (e.g., both being HVT regions). As another option, the critical/function cell can be moved to a different location in the macro block 201 so as not to border a cell with a different threshold voltage but to borders cells (functional and/or non-functional cells) with the same threshold voltage as the critical/function cell (e.g., both being HVT regions).

The shape requirements may refer to threshold voltage requirements, such as, for example, LVT regions, RVT regions, HVT regions.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilizes a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of structuring a semiconductor device, the method comprising:
    placing, by a computer system, first empty cells against hierarchical boundaries of a macro block;
    adding, by a computer system, functional cells in the macro block;
    filling, by a computer system, remaining areas with second empty cells in the macro block;

determining, by a computer system, shape requirements for the first empty cells and the second empty cells, the shape requirements comprising threshold voltage requirements, the threshold voltage requirements being determined for a least one or more of the second empty cells based on adjacent ones of the functional cells; and replacing, by a computer system, the first and second empty cells with determined shape requirements.

2. The method of claim 1, further comprising detecting at least one functional cell as at least one critical cell.

3. The method of claim 2, further comprising identifying any cells bordering the at least one functional cell as one or more identified cells.

4. The method of claim 3, further comprising determining that the one or more identified cells have a different shape requirement than the at least one functional cell.

5. The method of claim 4, further comprising in response to the one or more identified cells having the different shape requirement being one of more of the first empty cells and the second empty cells, changing the one or more identified cells to a same shape requirement as the at least one functional cell.

6. The method of claim 5, wherein the same shape requirement comprises a level for a threshold voltage.

7. The method of claim 4, further comprising in response to the one or more identified cells having the different shape requirement being one or more of the functional cells, moving the one or more identified cells to a location that does not border the at least one functional cell.

8. The method of claim 1, wherein the threshold voltage requirements for the at least one or more of the second empty cells are based on a level of a threshold voltage for the adjacent ones of the functional cells.

9. A computer program product for structuring a semiconductor device, the computer program product comprising a computer readable storage medium having program instructions embodied therewith, wherein the computer readable storage medium is not a transitory signal per se, the program instructions executable by a computer, to cause the computer to perform a method comprising:

placing first empty cells against hierarchical boundaries of a macro block;

adding functional cells in the macro block;

filling remaining areas with second empty cells in the macro block;

determining shape requirements for the first empty cells and the second empty cells, the shape requirements comprising threshold voltage requirements, the threshold voltage requirements being determined for at least one or more of the second empty cells based on adjacent ones of the functional cells; and replacing the first and second empty cells with determined shape requirements.

10. The computer program product of claim 9, further comprising detecting at least one functional cell as at least one critical cell.

11. The computer program product of claim 10, further comprising identifying any cells bordering the at least one functional cell as one or more identified cells.

12. The computer program product of claim 11, further comprising determining that the one or more identified cells have a different shape requirement than the at least one functional cell.

13. The computer program product of claim 12, further comprising in response to the one or more identified cells having the different shape requirement being one or more of the first empty cells and the second empty cells, changing the one or more identified cells to a same shape requirement as the at least one functional cell.

14. The computer program product of claim 13, wherein the same shape requirement comprises a level for a threshold voltage.

15. The computer program product of claim 12, further comprising in response to the one or more identified cells having the different shape requirement being one of more of the functional cells, moving the one or more identified cells to a location that does not border the at least one functional cell.

16. A computing system for structuring a semiconductor device, the computing system comprising:

at least one processor; and memory comprising computer-executable instructions that, when executed by the at least one processor, cause the at least one processor to perform operations comprising:

placing first empty cells against hierarchical boundaries of a macro block;

adding functional cells in the macro block;

filling remaining areas with second empty cells in the macro block;

determining shape requirements for the first empty cells and the second empty cells, the shape requirements comprising threshold voltage requirements, the threshold voltage requirements being determined for at least one or more of the second empty cells based on adjacent ones of the functional cells; and replacing the first and second empty cells with determined shape requirements.

17. The computing system of claim 16, further comprising detecting at least one functional cell as at least one critical cell.

18. The computer system of claim 17, further comprising identifying any cells bordering the at least one functional cell as one or more identified cells.

19. The computer system of claim 18, further comprising determining that the one or more identified cells have a different shape requirement than the at least one functional cell; and in response to the one or more identified cells having the different shape requirement being one or more of the first empty cells and the second empty cells, changing the one or more identified cells to a same shape requirement as the at least one functional cell.

* * * * *